(12) United States Patent
Suganuma

(10) Patent No.: US 8,443,264 B2
(45) Date of Patent: May 14, 2013

(54) DISK ARRAY APPARATUS, A DISK ARRAY APPARATUS CONTROL METHOD AND A PROGRAM FOR A DISK ARRAY APPARATUS

(75) Inventor: Shigeru Suganuma, Tokyo (JP)

(73) Assignee: NEC Corporation, Tokyo (JP)

( * ) Notice: Subject to any disclaimer, the term of this patent is extended or adjusted under 35 U.S.C. 154(b) by 305 days.

(21) Appl. No.: 12/816,444

(22) Filed: Jun. 16, 2010

(65) Prior Publication Data

US 2010/0332948 A1    Dec. 30, 2010

(30) Foreign Application Priority Data

Jun. 24, 2009  (JP) .................................. 2009-150110

(51) Int. Cl.
*G11C 29/00* (2006.01)
*H03M 13/00* (2006.01)

(52) U.S. Cl.
USPC .......................................... 714/770; 714/781

(58) Field of Classification Search .................. 714/763, 714/770, 781, 784
See application file for complete search history.

(56) References Cited

U.S. PATENT DOCUMENTS

| | | | | |
|---|---|---|---|---|
| 5,499,253 A | * | 3/1996 | Lary | 714/770 |
| 5,996,105 A | * | 11/1999 | Zook | 714/755 |
| 6,732,317 B1 | * | 5/2004 | Lo | 714/757 |
| 6,748,488 B2 | * | 6/2004 | Byrd et al. | 711/114 |
| 6,934,904 B2 | * | 8/2005 | Talagala et al. | 714/770 |
| 7,539,924 B1 | * | 5/2009 | Vasquez et al. | 714/770 |
| 7,647,544 B1 | * | 1/2010 | Masiewicz | 714/770 |
| 7,657,823 B1 | * | 2/2010 | Tang et al. | 714/784 |

FOREIGN PATENT DOCUMENTS

| | | |
|---|---|---|
| JP | 2006107311 A | 4/2006 |
| JP | 2007317271 A | 12/2007 |

* cited by examiner

*Primary Examiner* — James C Kerveros

(57) ABSTRACT

A disk array apparatus includes a plurality of magnetic disks, and a RAID controller that generates redundancy data for host data received from a host apparatus by a primitive polynomial of Galois extension field, generates a redundancy code for the host data and the redundancy data, the redundancy code is a cyclic code calculated by a generating polynomial identical to the primitive polynomial, and writes the host data and the redundancy data to the plurality of magnetic disks.

18 Claims, 13 Drawing Sheets

$$d_j = \begin{pmatrix} d_{j0} \\ d_{j1} \\ d_{j2} \\ \vdots \\ d_{j15} \end{pmatrix}$$

FIG.9

$$Cd = \begin{pmatrix} cd_0 \\ cd_1 \\ cd_2 \\ \vdots \\ cd_{15} \end{pmatrix}$$

FIG.10

$Cd(0,0) = T \cdot e_0 \cdot d_{00} = T \cdot e_0 \cdot (e_0^T \cdot R^0 \cdot d_0)$ $Cd(0,1) = T \cdot e_0 \cdot d_{01} + T \cdot Cd(0,0)$ $= T \cdot e_0 \cdot (e_0^T \cdot R^1 \cdot d_0) + T^2 \cdot e_0 \cdot (e_0^T \cdot R^0 \cdot d_0)$ $= T^2 \cdot R^{-1} \cdot e_0 \cdot (e_0^T \cdot R^1 \cdot d_0) + T^2 \cdot e_0 \cdot (e_0^T \cdot R^0 \cdot d_0)$ $= T^2 \cdot (R^{-1} \cdot e_0 \cdot e_0^T \cdot R^1 + e_0 \cdot e_0^T) \cdot d_0$ $= T^2 \cdot (e_1 \cdot e_1^T + e_0 \cdot e_0^T) \cdot d_0$ $\ldots$ $Cd(0,15) = T^{16} \cdot (\sum_{k=0}^{15} e_k \cdot e_k^T) \cdot d_0 = T^{16} \cdot I \cdot d_0 = T^{16} \cdot d_0$ $Cd(1,0) = T \cdot e_0 \cdot d_{10} + T \cdot Cd(0,15) = T \cdot e_0 \cdot (e_0^T \cdot R^0 \cdot d_1) + T \cdot Cd(0,15)$ $Cd(1,1) = T \cdot e_0 \cdot d_{11} + T \cdot Cd(1,0)$ $= T \cdot e_0 \cdot (e_0^T \cdot R^1 \cdot d_1) + T \cdot (T \cdot e_0 \cdot (e_0^T \cdot R^0 \cdot d_1) + T \cdot Cd(0,15) \;)$ $= T^2 \cdot R^{-1} \cdot e_0 \cdot (e_0^T \cdot R^1 \cdot d_1) + T^2 \cdot e_0 \cdot (e_0^T \cdot R^0 \cdot d_1) + T^2 \cdot Cd(0,15)$ $= T^2 \cdot (R^{-1} \cdot e_0 \cdot e_0^T \cdot R^1 + e_0 \cdot e_0^T) \cdot d_1 + T^2 \cdot Cd(0,15)$ $= T^2 \cdot (e_1 \cdot e_1^T + e_0 \cdot e_0^T) \cdot d_1 + T^2 \cdot Cd(0,15)$ $\ldots$ $Cd(1,15) = T^{16} \cdot (\sum_{k=0}^{15} e_k \cdot e_k^T) \cdot d_1 + T^{16} \cdot Cd(0,15) = T^{16} \cdot d_1 + T^{32} \cdot d_0$

FIG.11

$$Cd = T^{16} \cdot d_{(N-1)} + T^{32} \cdot d_{(N-2)} + \cdots + T^{16(N-1)} \cdot d_1 + T^{16N} \cdot d_0 = \sum_{j=0}^{N-1} T^{16(N-j)} \cdot d_j$$

FIG.12

$$R = \begin{pmatrix} 0 & 1 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 0 & 1 \\ 1 & 0 & 0 & 0 & 0 & 0 & 0 & 0 & 0 & 0 & 0 & 0 & 0 & 0 & 0 & 0 \end{pmatrix}$$

FIG.13

$$T = \begin{pmatrix} 1 & 1 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ 1 & 0 & 0 & 0 & 0 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 \\ 1 & 0 & 0 & 0 & 0 & 0 & 0 & 1 & 0 & 0 & 0 & 0 & 0 & 0 & 0 & 0 \\ 1 & 0 & 0 & 0 & 0 & 0 & 0 & 0 & 1 & 0 & 0 & 0 & 0 & 0 & 0 & 0 \\ 1 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 1 & 0 & 0 & 0 & 0 & 0 \\ 1 & 0 & 0 & 0 & 0 & 0 & 0 & 0 & 0 & 0 & 0 & 1 & 0 & 0 & 0 & 0 \\ 1 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 1 & 0 & 0 \\ 1 & 0 & 0 & 0 & 0 & 0 & 0 & 0 & 0 & 0 & 0 & 0 & 0 & 0 & 1 & 0 \\ 1 & 0 & 0 & 0 & 0 & 0 & 0 & 0 & 0 & 0 & 0 & 0 & 0 & 0 & 0 & 1 \\ 1 & 0 & 0 & 0 & 0 & 0 & 0 & 0 & 0 & 0 & 0 & 0 & 0 & 0 & 0 & 0 \end{pmatrix}$$

FIG.14

$$e_0 = \begin{pmatrix} 1 \\ 0 \\ 0 \\ \vdots \\ 0 \\ 0 \end{pmatrix} \quad e_1 = \begin{pmatrix} 0 \\ 1 \\ 0 \\ \vdots \\ 0 \\ 0 \end{pmatrix} \quad \cdots \quad e_{15} = \begin{pmatrix} 0 \\ 0 \\ 0 \\ \vdots \\ 0 \\ 1 \end{pmatrix}$$

FIG.15

$$A_{ij} = \begin{pmatrix} A_{ij0} \\ A_{ij1} \\ A_{ij2} \\ \vdots \\ A_{ij15} \end{pmatrix} \quad B_{ij} = \begin{pmatrix} B_{ij0} \\ B_{ij1} \\ B_{ij2} \\ \vdots \\ B_{ij15} \end{pmatrix} \quad P_{ij} = \begin{pmatrix} p_{ij0} \\ p_{ij1} \\ p_{ij2} \\ \vdots \\ p_{ij15} \end{pmatrix} \quad Q_{ij} = \begin{pmatrix} q_{ij0} \\ q_{ij1} \\ q_{ij2} \\ \vdots \\ q_{ij15} \end{pmatrix}$$

FIG.16

$$Ca_i = \sum_{j=0}^{R-1} T^{16(R-j)} \cdot A_{ij}$$

$$Cb_i = \sum_{j=0}^{R-1} T^{16(R-j)} \cdot B_{ij}$$

$$Cp_i = \sum_{j=0}^{N-1} T^{16(N-j)} \cdot P_{ij}$$
$$= \sum_{j=0}^{N-1} T^{16(N-j)} \cdot (A_{ij} + B_{ij})$$
$$= \sum_{j=0}^{N-1} T^{16(N-j)} \cdot A_{ij} + \sum_{j=0}^{N-1} T^{16(N-j)} \cdot B_{ij}$$
$$= Ca_i + Cb_i$$

FIG.20

$$Cq_i = \sum_{j=0}^{N-1} T^{16(N-j)} \cdot Q_{ij}$$
$$= \sum_{j=0}^{N-1} T^{16(N-j)} \cdot (A_{ij} + T \cdot B_{ij})$$
$$= \sum_{j=0}^{N-1} T^{16(N-j)} \cdot A_{ij} + \sum_{j=0}^{N-1} T^{16(N-j)} \cdot T \cdot B_{ij}$$
$$= Ca_i + T \cdot Cb_i$$

DISK ARRAY APPARATUS, A DISK ARRAY APPARATUS CONTROL METHOD AND A PROGRAM FOR A DISK ARRAY APPARATUS

This application is based upon and claims the benefit of priority from Japanese Patent Application No. 2009-150110, filed on Jun. 24, 2009, the disclosure of which is incorporated herein in its entirety by reference.

TECHNICAL FIELD

The present invention relates to a disk array apparatus, a disk array apparatus control method and a program for a disk array apparatus, in particular, relates to a disk array apparatus, a disk array apparatus control method and a program for a disk array apparatus which add a redundancy code to data and redundancy data.

BACKGROUND ART

As an installation method of a disk array apparatus, RAID (Redundant Arrays of Inexpensive Disks) is known. Based on a technology defined as RAID1 to RAID5, a RAID system adds redundancy data (parity) to data written over a plurality of magnetic disks and prevents data loss caused by a fault of a single magnetic disk. Furthermore, a technology called RAID6 or double parity (multiple redundant disk array apparatus) is proposed. The technology prevents, using a plurality of redundant disks, data loss caused by faults of a plurality of magnetic disks.

In such a disk array apparatus, when the magnetic disk returns a normal response in reply to a write process to a single magnetic disk, the disk array apparatus judges that the write process ends normally. However, when a fault occurs on the magnetic disk, it may cause an unfinished write failure in which data is not written on the medium of the magnetic disk even if the normal response is returned. When the unfinished write failure occurs, old data before write operation is read out in a read process from the magnetic disk. However, in this case, the read process itself ends normally.

As a detection method of the unfinished write failure, the following method is known. The method adds a redundancy code such as an assurance code or a cyclic code (CRC (Cyclic Redundancy Check)) to the data and the redundancy data and compares the data or the redundancy data with the redundancy code when reading the data or the redundancy data.

For example, a disk array apparatus of Japanese Patent Application Laid-Open No. 2006-107311 calculates an assurance code for each of data and redundancy data when writing the data, and saves the assurance code on a different disk from the disk on which the data or the redundancy data is written. And when data is read from the disk, the disk array apparatus detects that an error has occurred in the data by using the assurance code.

Further, as another related technology, in Japanese Patent Application Laid-Open No. 2007-317271, a data storage apparatus using a Reed-Solomon code operable on Galois extension field as CRC is disclosed.

SUMMARY

An exemplary object of the invention is to provide a disk array apparatus, a disk array apparatus control method and a program for a disk array apparatus which solves a problem that calculation of a redundancy code (CRC) for redundancy data takes much time.

A disk array apparatus according to an exemplary aspect of the invention includes a plurality of magnetic disks, and a RAID controller that generates redundancy data for host data received from a host apparatus by a primitive polynomial of Galois extension field, generates a redundancy code for the host data and the redundancy data, the redundancy code is a cyclic code calculated by a generating polynomial identical to the primitive polynomial, and writes the host data and the redundancy data to the plurality of magnetic disks.

A disk array control method according to an exemplary aspect of the invention includes generating redundancy data for host data received from a host apparatus by a primitive polynomial of Galois extension field, generating a redundancy code for the host data and the redundancy data, the redundancy code is a cyclic code calculated by a generating polynomial identical to the primitive polynomial, and writing the host data and the redundancy data to a plurality of magnetic disks.

A computer readable medium recording thereon a program according to an exemplary aspect of the invention, causing computer to perform a method includes generating redundancy data for host data received from a host apparatus by a primitive polynomial of Galois extension field, generating a redundancy code for the host data and the redundancy data, the redundancy code is a cyclic code calculated by a generating polynomial identical to the primitive polynomial, and writing the host data and the redundancy data to a plurality of magnetic disks.

A disk array apparatus according to an exemplary aspect of the invention includes a storage means including a plurality of magnetic disks, and a control means for generating redundancy data for host data received from a host apparatus by a primitive polynomial of Galois extension field, generating a redundancy code for the host data and the redundancy data, the redundancy code is a cyclic code calculated by a generating polynomial identical to the primitive polynomial, and writing the host data and the redundancy data to the plurality of magnetic disks.

BRIEF DESCRIPTION OF THE DRAWINGS

Exemplary features and advantages of the present invention will become apparent from the following detailed description when taken with the accompanying drawings in which:

FIG. 7 is an exemplary figure showing an example of a generating polynomial of CRC.

FIG. 8 is an exemplary figure showing a vector representation of input data of CRC.

FIG. 9 is an exemplary figure showing a vector representation of a CRC.

FIG. 10 is an exemplary figure showing a method of calculation of a CRC.

FIG. 11 is an exemplary figure showing a method of calculation of a CRC.

FIG. 12 is an exemplary figure showing a definition of matrix R.

FIG. 13 is an exemplary figure showing a definition of matrix T.

FIG. 14 is an exemplary figure showing a definition of matrix ek.

FIG. 15 is an exemplary figure showing vector representations of host data A and B and redundancy data P and Q.

FIG. 16 is an exemplary figure showing a method of calculation of a CRC for the host data A and B.

FIG. 17 is an exemplary figure showing a definition of the redundancy data P.

FIG. 18 is an exemplary figure showing a definition of the redundancy data Q.

FIG. 19 is an exemplary figure showing a method of calculation of a CRC for the redundancy data P.

FIG. 20 is an exemplary figure showing a method of calculation of a CRC for the redundancy data Q.

EXEMPLARY EMBODIMENT

First Exemplary Embodiment

Next, a first exemplary embodiment is described in detail with reference to the drawings.

Figure 1:
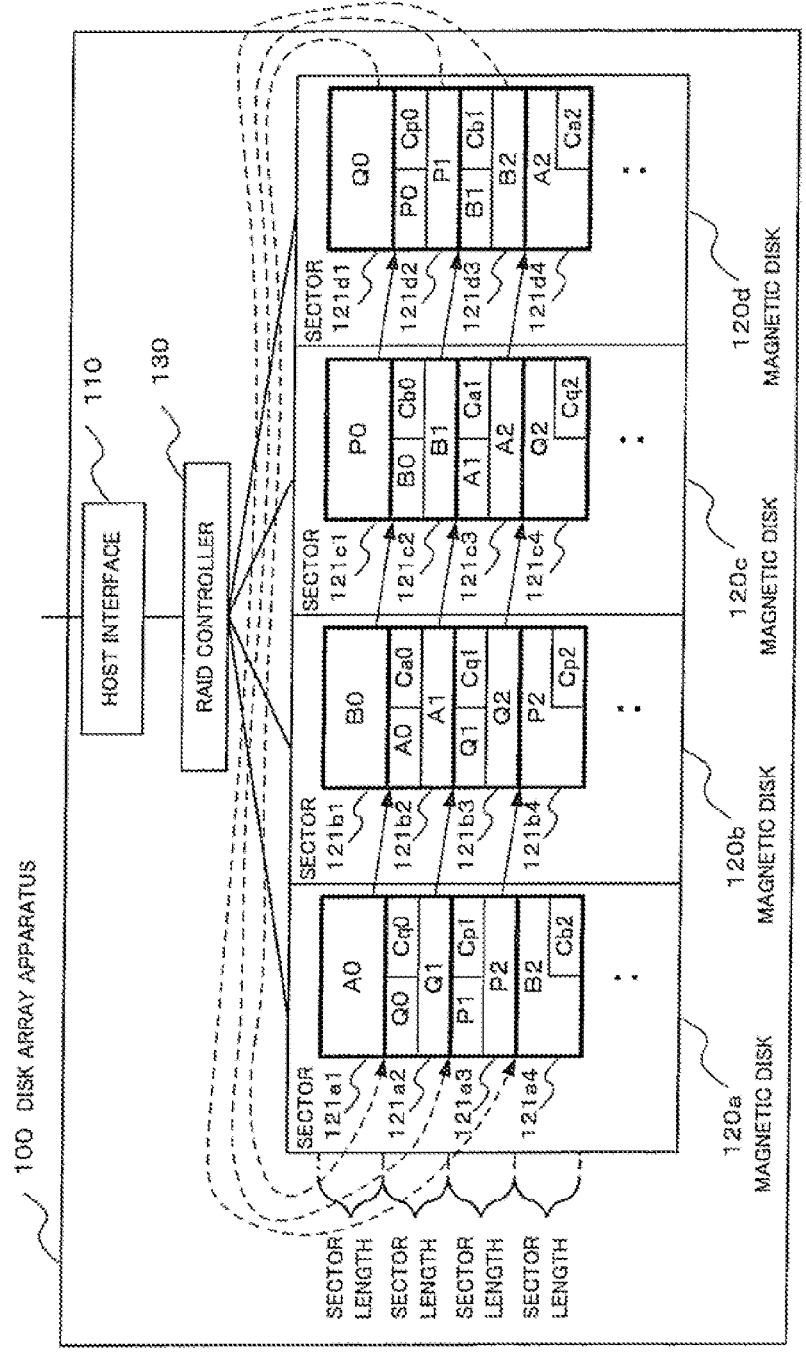
FIG. 1 is an exemplary diagram showing a configuration of a first exemplary embodiment.

FIG. 1 is an exemplary diagram showing a configuration of the first exemplary embodiment. Referring to FIG. 1, the first exemplary embodiment of a disk array apparatus 100 includes a host interface 110, a plurality of magnetic disks 120 (120a to 120d) and a RAID controller 130.

Here, the host interface 110 receives a command and host data from a host apparatus and sends them to the RAID controller 130.

The magnetic disk 120 is divided into a plurality of write units (sectors 121, for example) and provides a write operation and a read operation according to the length of the write unit (the sector length) to the RAID controller 130.

The RAID controller 130 provides a write operation and a read operation of the host data over a plurality of magnetic disks 120 to the host interface 110. The RAID controller 130 generates redundancy data based on the host data received from the host interface 110 and writes the host data and the redundancy data to the magnetic disks 120. Further the RAID controller 130 calculates a cyclic code (CRC) as a redundancy code to detect an error of the host data or the redundancy data written in the magnetic disk 120 and writes it to the magnetic disk 120.

In the first exemplary embodiment, the RAID controller 130 performs the write operation and the read operation to the magnetic disks 120 based on RAID6. The RAID controller 130 uses parity P (also referred to as redundancy data P) calculated by XOR for host data A and B and parity Q (also referred to as redundancy data Q) calculated by a primitive polynomial of Galois extension field as the redundancy data. Further the RAID controller 130 uses a polynomial which is identical to a generating polynomial of the CRC as the primitive polynomial of Galois extension field to calculate the parity Q.

Here, a processing unit of data is a unit of data in which the RAID controller 130 provides the write operation and the read operation to/from the host interface 110. In the first exemplary embodiment, CRC's for the host data A, B and the redundancy data P, Q are added for each processing unit of the host data and the redundancy data (Ai, Bi, Pi and Qi) respectively. Further, a processing unit of the host data or the redundancy data and its CRC are written over two different magnetic disks 120. At that time the whole of a CRC is written into one of the two different magnetic disks 120.

For example, in FIG. 1, for each processing unit of the host data A0 and B0 and for each processing unit of the redundancy data P0 and Q0, bit strings Ca0, Cb0, Cp0 and Cq0 are added as CRC's respectively. Further, the processing unit of the host data A0 and its CRC Ca0 are written over sector 121a1 of magnetic disk 120a and sector 121b2 of magnetic disk 120b. The whole of Ca0 is written into sector 121b2 of magnetic disk 120b.

Further, the RAID controller 130 may be an information processing apparatus which operates by a program control.

Next, a calculation method of a CRC in the first exemplary embodiment is described with reference to the drawings.

FIG. 7 is an exemplary figure showing an example of a generating polynomial of a CRC. Here, as the generating polynomial of a CRC, for example, GF(x) shown in FIG. 7 is used.

First, input data (bit string) is supposed to be d. A CRC for input data d is calculated by inputting one bit out of input data d to GF(x) successively.

FIG. 8 is an exemplary figure showing a vector representation of input data of a CRC. Input data d is divided into 16 bit vector data dj (j=0, N−1) as shown in FIG. 8. In this case, the CRC is calculated by inputting one bit out of each vector data dj to GF(x) successively.

FIG. 9 is an exemplary figure showing a vector representation of a CRC. FIG. 10 and FIG. 11 are exemplary figures showing a method of calculation of a CRC. Here, a CRC calculated for the input data d is represented as vector data Cd as shown in FIG. 9. Further, when from the 0-th bit of data d0 to the k-th bit of data dj are inputted to GF(x), the CRC is represented as Cd(j, k). When all the bits of data d0 and d1 are inputted to GF(x), CRC's Cd(0, 15) and Cd(1, 15) are represented as shown in FIG. 10.

FIG. 12, FIG. 13 and FIG. 14 are exemplary figures showing definitions of matrices R, T and ek respectively which appeared in FIG. 10 and FIG. 11. Matrix R is a matrix to shift vector data by one bit. Each element of the leftmost column of matrix T corresponds to each of the exponential terms of the generating polynomial GF(x) of a CRC. Matrix T is called a companion matrix.

Further, when all the bits of the input data d are inputted to GF(x), CRC Cd is represented as the summation of the product of dj and companion matrix T to the power of 16(N−j) as shown in FIG. 11.

FIG. 15 is an exemplary figure showing vector representations of host data A and B and redundancy data P and Q. The processing units Ai, Bi, Pi and Qi of the host data and the redundancy data are divided into 16 bit vector data Aij, Bij, Pij and Qij as shown in FIG. 15.

FIG. 16 is an exemplary figure showing a method of calculation of a CRC for the host data A and B. If CRC's for the i-th host data Ai and Bi are represented as Cai and Cbi, Cai and Cbi are expressed as shown in FIG. 16 by the relationship in FIG. 11.

FIG. 17 and FIG. 18 are exemplary figures showing definitions of the redundancy data P and Q. Here, the redundancy data Pi for the host data Ai and Bi are defined as shown in FIG. 17. Further, the redundancy data Qi for the host data Ai and Bi are defined as shown in FIG. 18 by using companion matrix T. Here, the polynomial in FIG. 18 is a primitive polynomial of Galois extension field in accordance with a Reed-Solomon code.

FIG. 19 and FIG. 20 are exemplary figures showing methods of calculation of CRC's for the redundancy data P and Q. If a CRC for the redundancy data Pi is represented as Cpi, Cpi is expressed with Cai and Cbi as shown in FIG. 19 by the relationships in FIG. 16 and FIG. 17. Similarly, if a CRC for the redundancy data Qi is represented as Cqi, Cqi is expressed with Cai and Cbi as shown in FIG. 20 by the relationships in FIG. 16 and FIG. 18.

As mentioned above, CRC's Cpi and Cqi for the redundancy data are calculated directly by using CRC's Cai and Cbi which are calculated for the host data.

Next, an operation of the first exemplary embodiment is described with reference to the drawings.

First, a write process of the first exemplary embodiment is described.

Here, host data A (A0, A1, A2, . . . ) and B (B0, B1, B2, . . . ) are written to the magnetic disk 120 in FIG. 1, as an example.

Figure 3:
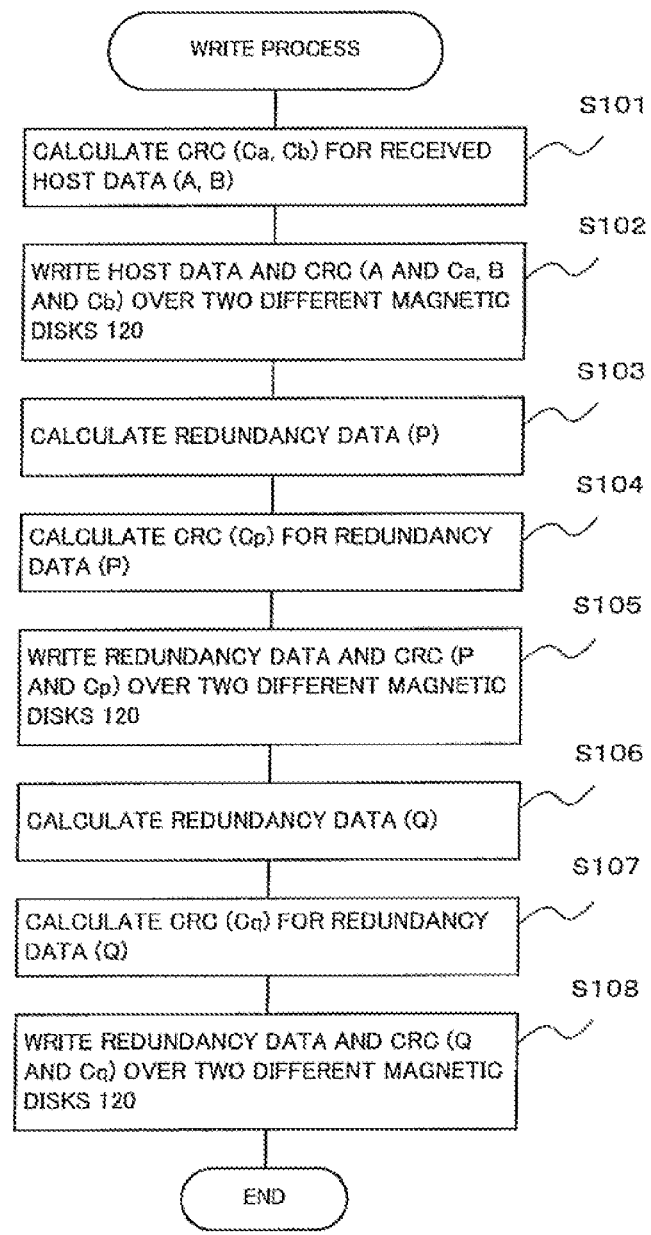
FIG. 3 is an exemplary flow chart showing an operation of a write process in the first exemplary embodiment.

FIG. 3 is an exemplary flow chart showing an operation of the write process in the first exemplary embodiment.

A RAID controller 130 calculates CRC's Ca and Cb for host data A and B received from a host interface 110 by the formula in FIG. 16 (Step S101). The RAID controller 130 writes the host data A and the calculated CRC Ca over two different magnetic disks 120. Similarly, the RAID controller 130 writes the host data B and the calculated CRC Cb over the two different magnetic disks 120 (Step S102). At that time, the RAID controller 130 divides and writes the host data A according to the write unit (the sector length) of the magnetic disk 120, and writes the whole of the CRC Ca into one of the two different magnetic disks 120. Similarly, the RAID controller 130 divides and writes the host data B according to the sector length, and writes the whole of the CRC Cb into one of the two different magnetic disks 120.

For example, in FIG. 1, the RAID controller 130 calculates CRC's Ca0 and Cb0 for host data A0 and B0 received from the host interface 110 by the formula in FIG. 16. Then the RAID controller 130 divides and writes A0 over sectors 121a1 and 121b2, and writes Ca0 into the sector 121b2 following A0. Further, the RAID controller 130 divides and writes B0 over sectors 121b1 and 121c2, and writes Cb0 into sector 121c2 following B0.

Next, the RAID controller 130 calculates redundancy data P from the host data A and B written in the magnetic disk 120 by the formula in FIG. 17 (Step S103). The RAID controller 130 calculates a CRC Cp for the redundancy data P with the CRC's Ca and Cb for the host data by the formula in FIG. 19 (Step S104). The RAID controller 130 writes the calculated redundancy data P and the CRC Cp over two different magnetic disks 120 (Step S105). At that time, similar to the case of the host data, the RAID controller 130 divides and writes the redundancy data P according to the sector length, and writes the CRC Cp into one of the two different magnetic disks 120.

For example, in FIG. 1, the RAID controller 130 calculates redundancy data P0 from host data A0 and B0 by the formula in FIG. 17. And the RAID controller 130 calculates CRC Cp0 for P0 with CRC's Ca0 and Cb0 by the formula in FIG. 19. The RAID controller 130 divides and writes P0 over sectors 121c1 and 121d2, and writes Cp0 into sector 121d2 following P0.

Further, the RAID controller 130 calculates redundancy data Q from the host data A and B written in the magnetic disk 120 by the formula in FIG. 18 (Step S106). The RAID controller 130 calculates a CRC Cq for the redundancy data Q with the CRC's Ca and Cb for the host data by the formula in FIG. 20 (Step S107). The RAID controller 130 writes the calculated redundancy data Q and the CRC Cq over two different magnetic disks 120 (Step S108). At that time, similar to the case of the host data, the RAID controller 130 divides and writes the redundancy data Q according to the sector length, and writes the CRC Cq into one of the two different magnetic disks 120.

For example, in FIG. 1, the RAID controller 130 calculates redundancy data Q0 from host data A0 and B0 by the formula in FIG. 18. And the RAID controller 130 calculates CRC Cq0 for Q0 with CRC's Ca0 and Cb0 by the formula in FIG. 20. The RAID controller 130 divides and writes Q0 over sectors 121d1 and 121a2, and writes Cq0 into sector 121a2 following Q0.

Further, the RAID controller 130 writes host data, redundancy data and CRC's for host data A1, A2, . . . and B1, B2, . . . which follow the host data A0 and B0 as shown in FIG. 1.

Next, a read process in the first exemplary embodiment is described.

Here, host data A0 is read from the magnetic disk 120 in FIG. 1, as an example.

Figure 4:
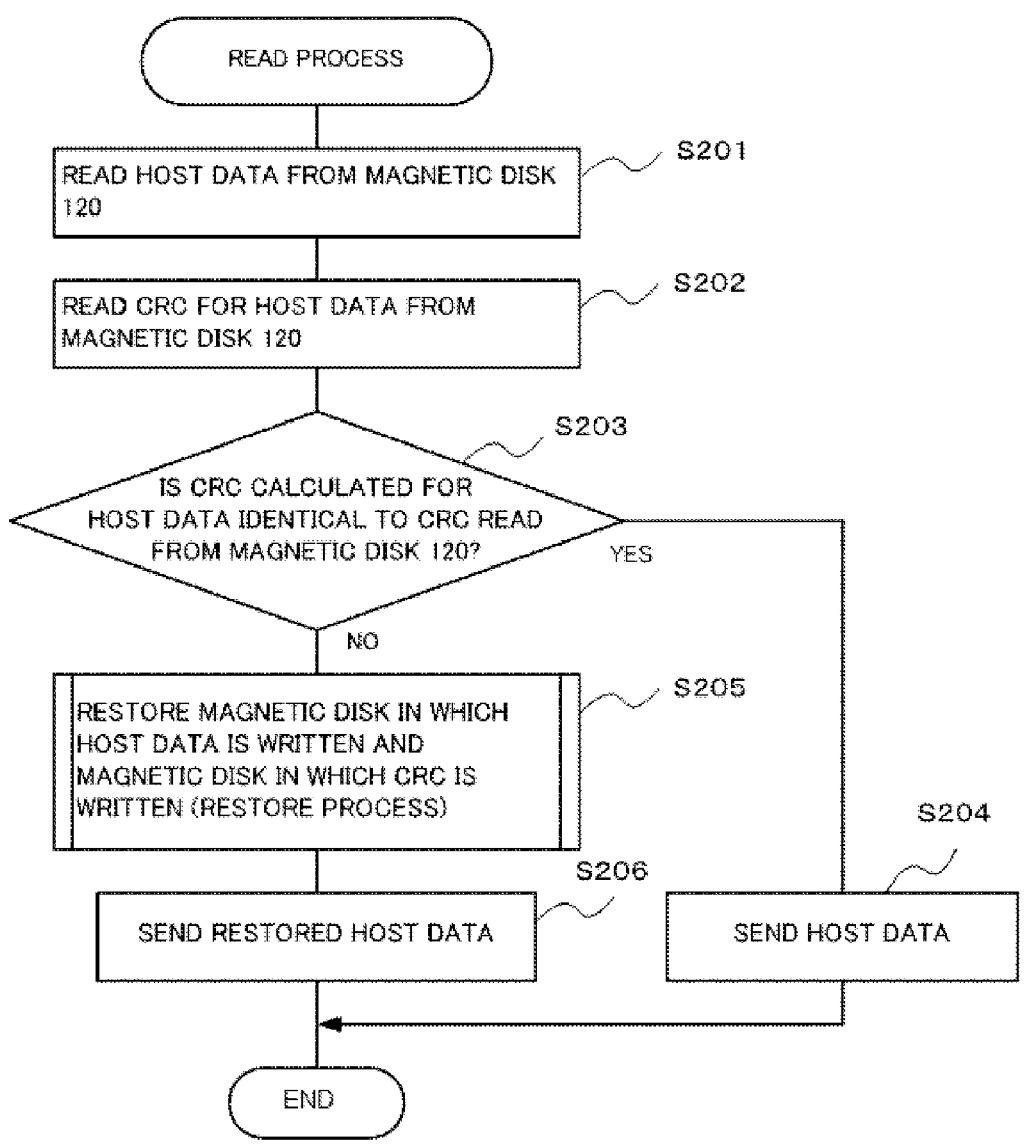
FIG. 4 is an exemplary flow chart showing an operation of a read process in the first exemplary embodiment.

FIG. 4 is an exemplary flow chart showing an operation of the read process in the first exemplary embodiment.

When a read command for host data is received from the host interface 110, a RAID controller 130 reads the host data from the sector 121 on the magnetic disk 120 where the host data is written (Step S201). The RAID controller 130 reads a CRC for the host data from the sector 121 on the magnetic disk 120 where the CRC is written (Step S202). The RAID controller 130 compares a CRC calculated for the host data by the formula in FIG. 16 with the CRC read from the magnetic disk 120 (Step S203).

For example, in FIG. 1, when a read command for host data A0 is received from the host interface 110, the RAID controller 130 reads A0 from sectors 121a1 and 121b2 and CRC Ca0 from sector 121b2. The RAID controller 130 compares a CRC for A0 calculated by the formula in FIG. 16 with Ca0 read from sector 121b2.

When the CRC calculated by the formula in FIG. 16 is identical to the CRC read from the magnetic disk 120 in step S203, the host data read from the magnetic disk 120 is correct, and the RAID controller 130 sends the host data to the host interface 110 (Step S204).

On the other hand when the CRC calculated by the formula in FIG. 16 is not identical to the CRC read from the magnetic disk 120 in step S203, either an unfinished write failure of the host data or the CRC read from the magnetic disk 120, or a fault of the magnetic disk 120 in which the host data or the CRC is written has occurred. In this case, the RAID controller 130 restores the magnetic disk 120 in which the host data is written and the magnetic disk 120 in which the CRC is written from the other magnetic disks 120 (Step S205). The RAID controller 130 sends the restored host data to the host interface 110 (Step S206).

For example, in FIG. 1, when CRC calculated for host data A0 read from sectors 121a1 and 121b2 is not identical to CRC Ca0 read from sector 121b2, the RAID controller 130 restores magnetic disks 120a and 120b from magnetic disks 120c and 120d.

Figure 5:
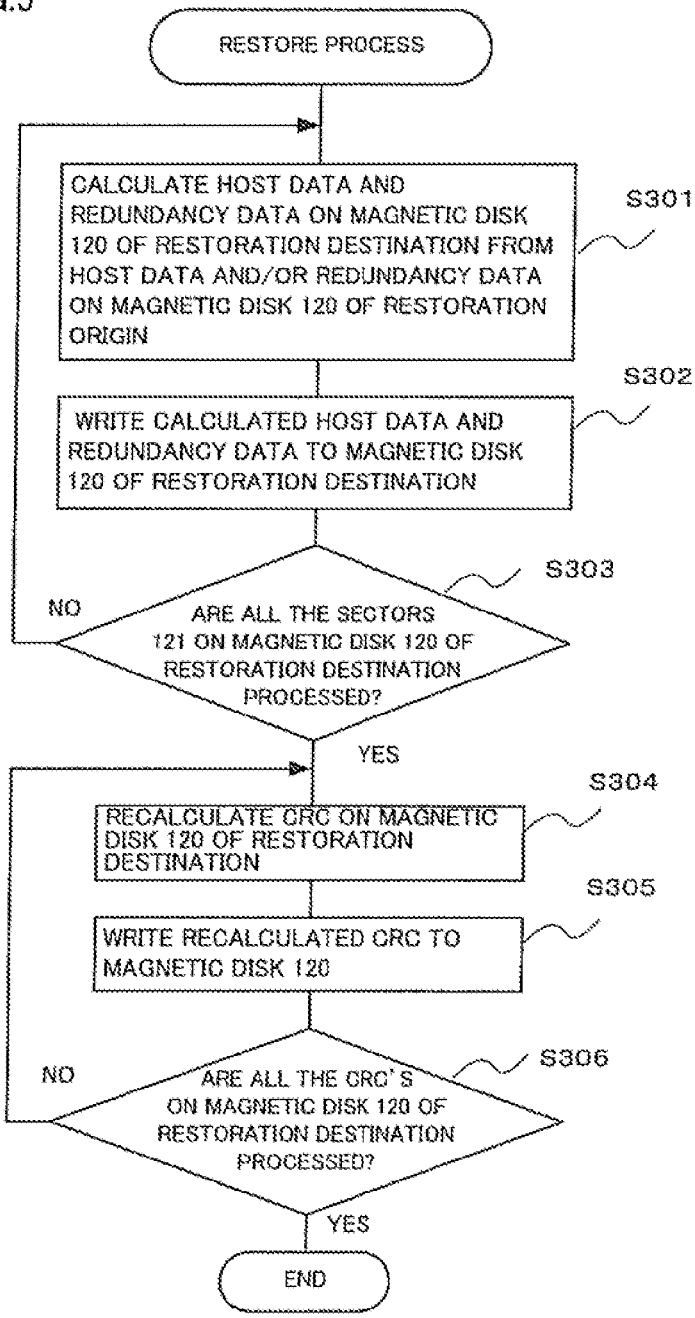
FIG. 5 is an exemplary flow chart showing an operation of a restore process in the first exemplary embodiment.

FIG. 5 is an exemplary flow chart showing an operation of the restore process (Step S205) in the first exemplary embodiment.

A RAID controller 130 calculates host data or redundancy data on the magnetic disks 120 of the restoration destination from host data and/or redundancy data on the magnetic disks 120 of restoration origin by the formulas in FIG. 17 and FIG. 18 for each sector 121 on the magnetic disks 120 of the restoration destination (Step S301). The RAID controller 130 writes the calculated host data or redundancy data to the magnetic disks 120 of the restoration destination (Step S302).

The RAID controller 130 repeats steps S301 and S302 for all the sectors 121 on the magnetic disks 120 of the restoration destination (Step S303).

For example, in FIG. 1, when restoring magnetic disks 120a and 120b, the RAID controller 130 calculates host data A0 in sector 121a1 and host data B0 in sector 121b1 from redundancy data P0 in sector 121c1 and redundancy data Q0 in sector 121d1 by the formulas in FIG. 17 and FIG. 18. The RAID controller 130 writes calculated A0 and B0 to sector 121a1 and sector 121b1 respectively. Also the RAID controller 130 calculates redundancy data Q0 and Q1 in sector 121a2 and host data A0 and A1 in sector 121b2 from host data B0 and B1 in sector 121c2 and redundancy data P0 and P1 in sector 121d2 by the formulas in FIG. 17 and FIG. 18. The RAID controller 130 writes calculated Q0, Q1 and A0, A1 to sectors 121a2 and 121b2 respectively.

The RAID controller 130 calculates host data or redundancy data for the other sectors 121 on magnetic disks 120a and 120b from host data and/or redundancy data on magnetic disks 120c and 120d by the formulas in FIG. 17 and FIG. 18.

Next, the RAID controller 130 recalculates CRC's written in the magnetic disk 120 of the restoration destination from the corresponding host data or redundancy data by the formulas in FIG. 16, FIG. 19 and FIG. 20 (Step S304). At that time, the RAID controller 130 calculates a CRC for the redundancy data with a CRC for the host data by the formulas in FIG. 19 and FIG. 20. The RAID controller 130 writes the recalculated CRC to the magnetic disk 120 of the restoration destination (Step S305). The RAID controller 130 repeats steps S304 and S305 for all the CRC's on the magnetic disks 120 of the restoration destination (Step S306).

For example, in FIG. 1, the RAID controller 130 recalculates CRC Ca0 in sector 121b2 by the formula in FIG. 16. Also, the RAID controller 130 recalculates CRC Cq0 in sector 121a2 with CRC's Ca0 and Cb0 by the formula in FIG. 20. The RAID controller 130 writes recalculated Cq0 and Ca0 to sectors 121a2 and 121b2 respectively. The RAID controller 130 also recalculates the other CRC's on the magnetic disks 120a and 120b by the formulas in FIG. 16, FIG. 19 and FIG. 20 and writes them to the magnetic disks 120.

In this way, the operation of the first exemplary embodiment is completed.

By the way, in the above-mentioned read process, the case of the restore process where a CRC calculated for host data read from the magnetic disk 120 is not identical to a CRC read from the magnetic disk 120 for the host data is described as an example. Also, for the case where a CRC calculated for redundancy data read from the magnetic disk 120 is not identical to a CRC read from the magnetic disk 120 for the redundancy data, a similar process is performed.

Figure 2:
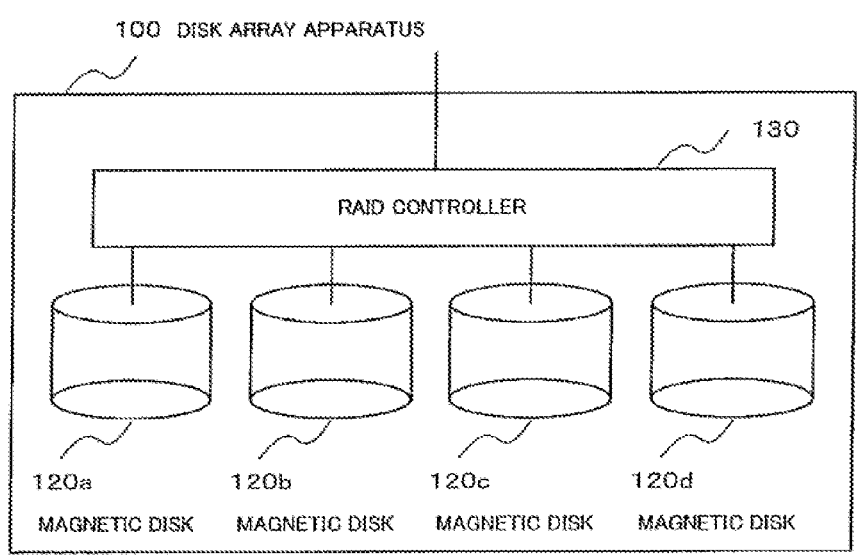
FIG. 2 is an exemplary diagram showing a characteristic configuration of the first exemplary embodiment.

Next, a characteristic configuration of the first exemplary embodiment is described. FIG. 2 is an exemplary diagram showing a characteristic configuration of the first exemplary embodiment. Referring to FIG. 2, a disk array apparatus 100 includes a plurality of magnetic disks 120 and a RAID controller 130. The RAID controller 130 generates redundancy data for host data received from a host apparatus by a primitive polynomial of Galois extension field, generates a redundancy code for the host data and the redundancy data, the redundancy code is a cyclic code calculated by a generating polynomial identical to the primitive polynomial, and writes the host data and the redundancy data to the plurality of magnetic disks 120.

According to the first exemplary embodiment, in a disk array apparatus which adds a cyclic code (CRC) as a redundancy code to redundancy data calculated by Galois extension field, calculating time of the redundancy code for the redundancy data can be reduced. The reason is because the RAID controller 130 can calculate redundancy code for redundancy data directly from the redundancy code for host data by using a polynomial which is identical to a generating polynomial of the redundancy code as a primitive polynomial of Galois extension field to generate the redundancy data.

Also according to the first exemplary embodiment, in a disk array apparatus, an unfinished write failure on a magnetic disk can be detected easily. The reason is because the RAID controller 130 writes host data or redundancy data and redundancy code added to the host data or the redundancy data over two different magnetic disks 120, and the whole of the redundancy code is written into one of the two different magnetic disks 120, and compares a redundancy code calculated for the host data or the redundancy data read from the magnetic disk 120 with the redundancy code read from the magnetic disk 120 when reading the host data from the magnetic disk 120.

Also according to the first exemplary embodiment, in a disk array apparatus, when an unfinished write failure occurs for host data or redundancy data on a magnetic disk, the host data or the redundancy data can be restored. The reason is because, when a redundancy code calculated for host data or redundancy data read from the magnetic disk 120 (a first magnetic disk) is not identical to a redundancy code read from the magnetic disk 120 (a second magnetic disk), the RAID controller 130 restores host data and redundancy data on the magnetic disks 120 in which the host data or the redundancy data is written (the first magnetic disk), and on the magnetic disk 120 in which the redundancy code is written (the second magnetic disk), based on host data and redundancy data on the other magnetic disks 120.

Also according to the first exemplary embodiment, in a disk array apparatus which adds a cyclic code (CRC) as a redundancy code to redundancy data calculated by Galois extension field, when an unfinished write failure on a magnetic disk or a fault of a magnetic disk occurs, the magnetic disk can be restored at high speed. The reason is because recalculating time for a redundancy code on the magnetic disk 120 to be restored is reduced by reducing calculating time for a redundancy code for redundancy data as mentioned above.

Second Exemplary Embodiment

Next, a second exemplary embodiment is described in detail with reference to the drawings.

Figure 6:
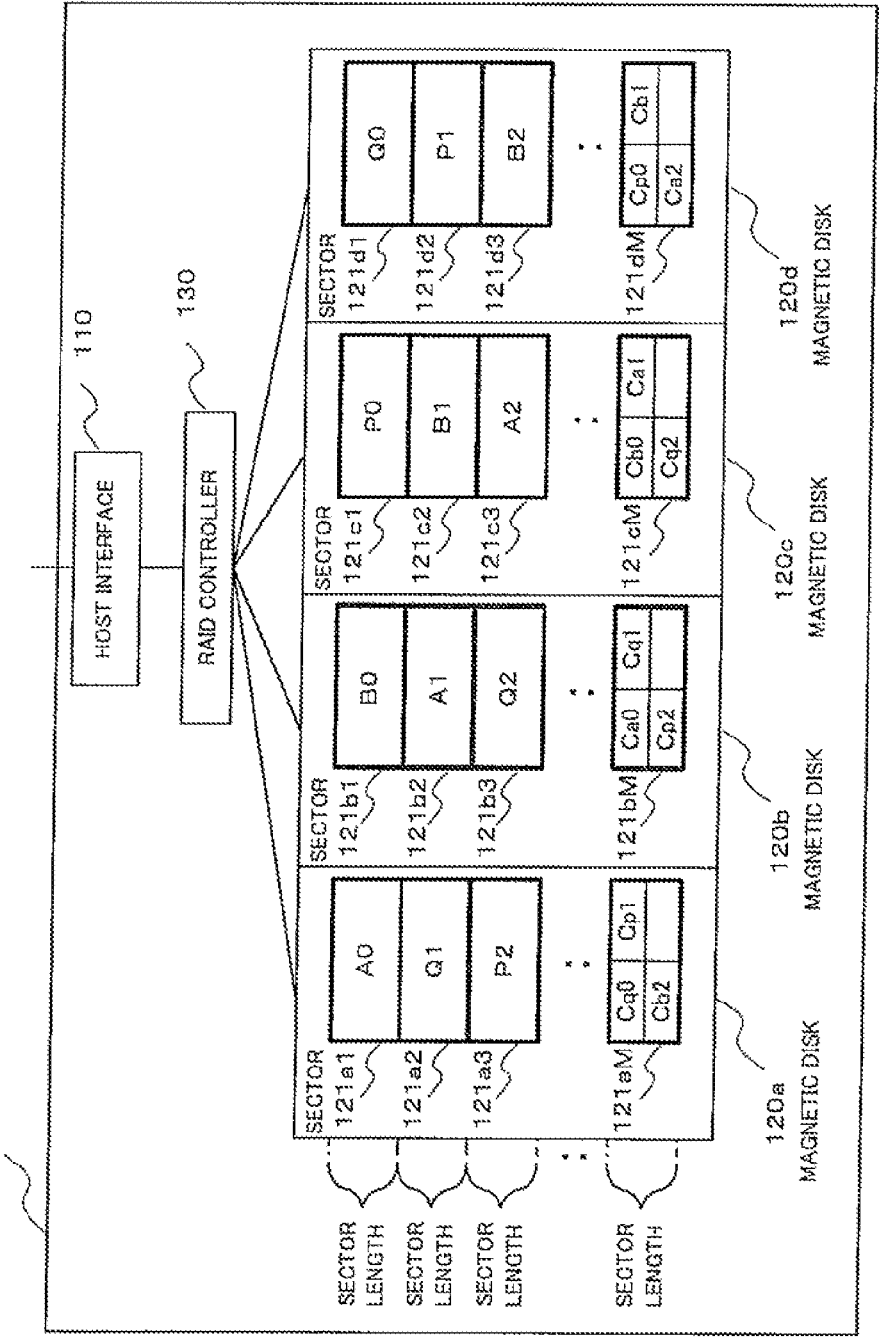
FIG. 6 is an exemplary diagram showing a configuration of a second exemplary embodiment.

FIG. 6 is an exemplary diagram showing a configuration of the second exemplary embodiment.

In the second exemplary embodiment, the a processing unit of host data and redundancy data is identical to the sector length of the magnetic disk 120, and CRC's for the host data and the redundancy data are written to a sector 121 which is dedicated to the CRC's on the magnetic disk 120.

An operation of the second exemplary embodiment is similar to the operation of the first exemplary embodiment (FIGS. 3 to 5) except that the processing unit of host data and redundancy data is identical to the sector length of the magnetic disk 120 and CRC's for the host data and the redundancy data are written to the a sector 121 dedicated to the CRC's.

First, a write process in the second exemplary embodiment is described.

Here, host data A (A0, A1, A2, . . . ) and B (B0, B1, B2, . . . ) are written to the magnetic disk 120 in FIG. 6, as an example.

In FIG. 6, the RAID controller 130 calculates CRC's Ca0 and Cb0 for host data A0 and B0 received from the host interface 110 by the formulas in FIG. 16. And the RAID controller 130 writes A0 to sector 121a1 and writes Ca0 to sector 121bM. Further, the RAID controller 130 writes B0 to sector 121b1 and writes Cb0 to sector 121cM.

Also the RAID controller 130 calculates redundancy data P0 and Q0 from host data A0 and B0 by the formulas in FIG. 17 and FIG. 18. Further, the RAID controller 130 calculates CRC's Cp0 and Cq0 for P0 and Q0 with Ca0 and Cb0 by the formulas in FIG. 19 and FIG. 20. The RAID controller 130 writes P0 and Q0 to sectors 121c1 and 121d1 and writes Cp0 and Cq0 to sectors 121dM and 121aM.

Further, the RAID controller 130 also writes host data, redundancy data and CRC's for host data A1, A2, and B1, B2, . . . which follow host data A0 and B0 as shown in FIG. 6.

Next, a read process in the second exemplary embodiment is described.

Here, host data A0 is read from the magnetic disk 120 in FIG. 6, as an example.

In FIG. 6, when a read command for host data A0 is received from the host interface 110, the RAID controller 130 reads A0 from sector 121a1 and CRC Ca0 from sector 121bM. The RAID controller 130 compares a CRC calculated by the formula in FIG. 16 for A0 with Ca0 read from sector 121bM. When CRC calculated for A0 read from sector 121a1 is not identical to Ca0 read from sector 121bM, the RAID controller 130 restores magnetic disks 120a and 120b from magnetic disks 120c and 120d.

In FIG. 6, when magnetic disks 120a and 120b are restored, the RAID controller 130 calculates host data A0 in sector 121a1 and host data B0 in sector 121b1 from redundancy data P0 in sector 121c1 and redundancy data Q0 in sector 121d1, by the formulas in FIG. 17 and FIG. 18. The RAID controller 130 writes calculated A0 and B0 to sector 121a1 and sector 121b1 respectively. Further the RAID controller 130 calculates redundancy data Q1 in sector 121a2 and host data A1 in sector 121b2 from host data B1 in sector 121c2 and, redundancy data P1 in sector 121d2, by the formulas in FIG. 17 and FIG. 18. The RAID controller 130 writes calculated Q1 and A1 to sectors 121a2 and 121b2 respectively.

The RAID controller 130 calculates host data or redundancy data for the other sectors 121 on magnetic disks 120a and 120b from host data and/or redundancy data on magnetic disks 120c and 120d by the formulas in FIG. 17 and FIG. 18.

Next, the RAID controller 130 recalculates CRC Ca0 in sector 121bM by the formula in FIG. 16. Further, the RAID controller 130 recalculates CRC Cq0 in sector 121aM with CRC's Ca0 and Cb0 by the formula in FIG. 20. The RAID controller 130 writes recalculated Cq0 and Ca0 to sectors 121aM and 121bM respectively.

The RAID controller 130 also recalculates the other CRC's on magnetic disks 120a and 120b by the formulas in FIG. 16, FIG. 19 and FIG. 20 and writes them to the magnetic disks 120.

In this way, the operation of the second exemplary embodiment is completed.

According to the second exemplary embodiment, in addition to the effect of the first exemplary embodiment, in a disk array apparatus, a redundancy code calculated for host data and redundancy data can be managed easily. The reason is because the RAID controller 130 generates a redundancy code for host data or redundancy data for each sector 121 on a magnetic disk 120 and writes the host data or the redundancy data and the redundancy code for the host data or the redundancy data to different magnetic disks 120 respectively.

In multiple redundant disk array apparatus like RAID6, redundancy data calculated by Galois extension field is used as redundancy data. For example, an operation method of redundancy data using Galois extension field in accordance with a Reed-Solomon code is shown in "A Tutorial on Reed-Solomon Coding for Fault-Tolerance in RAID-like Systems" by James S. Plank (Software Practice and Experience, Volume 27, Number 9, Sep. 1997, pages 995-1012). When a CRC is added to redundancy data calculated by Galois extension field, the CRC for the redundancy data is not obtained even if a CRC added to host data is operated by Galois extension field. The CRC added to the redundancy data calculated by Galois extension field is calculated from the redundancy data. For this reason, there is a problem that it takes time to calculate a CRC in data write operation or failure recovery.

An exemplary advantage according to the invention is to reduce the time needed to calculate a redundancy code of redundancy data, in a disk array apparatus which adds a CRC as the redundancy code to the redundancy data calculated by Galois extension field.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The invention claimed is:

1. A disk array apparatus, comprising:
a plurality of magnetic disks; and
a RAID controller that is configured to: generate redundancy data for host data received from a host apparatus by a primitive polynomial of Galois extension field, said redundancy data being usable to restore one of said plurality of magnetic disks; generate a redundancy code for said host data and a redundancy code for said redundancy data, said redundancy codes being usable to detect an error of a corresponding one of said host data and said redundancy data, said redundancy codes each being a cyclic code based on a generating polynomial which is identical to said primitive polynomial, said redundancy code for said host data being calculated from said host data by said generating polynomial and said redundancy code for said redundancy data being calculated from said redundancy code for said host data and write said host data and said redundancy data to said plurality of magnetic disks.

2. The disk array apparatus according to claim 1, wherein said RAID controller is configured to write (i) said host data and said redundancy code for said host data or (ii) said redundancy data and said redundancy code for the redundancy data over two magnetic disks of said plurality of magnetic disks, and said RAID controller is configured to write the whole of one of the redundancy codes into one of the two magnetic disks.

3. The disk array apparatus according to claim 2, wherein said RAID controller is configured to: generate said redundancy code for said host data or said redundancy code for said redundancy data for each write unit of said one of said magnetic disks; and write (i) said host data and said redundancy code for said host data or (ii) said redundancy data and said redundancy code for the redundancy data to said two magnetic disks.

4. The disk array apparatus according to claim 2, wherein said RAID controller is configured to: generate a plurality of pieces of said redundancy data for a plurality of pieces of said host data; and write the plurality of pieces of said host data and the plurality of pieces of said redundancy data to different magnetic disks of said plurality of magnetic disks, respectively;

and said RAID controller is configured such that, when said redundancy code calculated for a piece of said host data or a piece of said redundancy data read from a first magnetic disk of said plurality of magnetic disks is not identical to said redundancy code corresponding to the piece of said host data or the piece of said redundancy data read from a second magnetic disk of said plurality of magnetic disks, said RAID controller restores a whole of said first magnetic disk and said second magnetic disk by restoring a piece of said host data, a piece of said redundancy data, and said redundancy codes on said first magnetic disk and said second magnetic disk based on pieces of at least one of said host data and said redundancy data on the other magnetic disks of said plurality of magnetic disks.

5. The disk array apparatus according to claim 4, wherein said RAID controller is configured to regenerate said redundancy code on said first magnetic disk and said second magnetic disk.

6. The disk array apparatus of claim 1, wherein to generate said recovery codes, the RAID controller is configured to generate the redundancy code for said redundancy data to be usable to detect an error in said redundancy data.

7. The disk array apparatus of claim 1, wherein the RAID controller is configured to write the redundancy code for the host data and the redundancy code for the redundancy data to said plurality of magnetic disks.

8. A disk array control method, comprising:
  generating redundancy data for host data received from a host apparatus by a primitive polynomial of Galois extension field, said redundancy data being usable to restore one of a plurality of magnetic disks;
  generating a redundancy code for said host data and a redundancy code for said redundancy data, said redundancy codes being usable to detect an error of a corresponding one of said host data and said redundancy data, said redundancy codes each being a cyclic code based on a generating polynomial which is identical to said primitive polynomial, said redundancy code for said host data being calculated from said host data by said host data by said generating polynomial and said redundancy code for said redundancy data being calculated from said redundancy code for said host data; and
  writing said host data and said redundancy data to a plurality of magnetic disks.

9. The disk array control method according to claim 8, wherein when writing said host data and said redundancy data: writing said host data and said redundancy code for said host data or (ii) said redundancy data and said redundancy code for the redundancy data over two magnetic disks of said plurality of magnetic disks, and writing the whole of one of the redundancy codes into either of the two magnetic disks.

10. The disk array control method according to claim 9, wherein
  when generating said redundancy data, generating said redundancy code for said host data or said redundancy code for said redundancy data for each write unit of said magnetic disk, and
  when writing said host data and said redundancy data, writing (i) said host data and said redundancy code for said host data or (ii) said redundancy data and said redundancy code for the redundancy data to said two magnetic disks.

11. The disk array control method according to claim 9, wherein
  when generating said redundancy data, generating a plurality of pieces of said redundancy data for a plurality of pieces of said host data, and
  when writing said host data and said redundancy data, writing the plurality of pieces of said host data and the plurality of pieces of said redundancy data to different magnetic disks of said plurality of magnetic disks, respectively, and
  further comprising:
  restoring, when said redundancy code calculated for a piece of said host data or a piece of said redundancy data read from a first magnetic disk of said plurality of magnetic disks is not identical to said redundancy code corresponding to the piece of said host data or the piece of said redundancy data read from a second magnetic disk of said plurality of magnetic disks, a whole of said first magnetic disk and said second magnetic disk by restoring a piece of said host data, a piece of said redundancy data, and said redundancy codes on said first magnetic disk and said second magnetic disk based on pieces of at least one of said host data and said redundancy data on the other magnetic disks of said plurality of magnetic disks.

12. The disk array control method according to claim 11, wherein
  when restoring said host data and said redundancy data, regenerating said redundancy code on said first magnetic disk and said second magnetic disk.

13. A computer readable medium storing a program that, when executed by computer, causes the computer to perform a method comprising:
  generating redundancy data for host data received from a host apparatus by a primitive polynomial of Galois extension field, said redundancy data being usable to restore one of a plurality of magnetic disks;
  generating a redundancy code for said host data and a redundancy code for said redundancy data, said redundancy codes being usable to detect an error of a corresponding one of said host data and said redundancy data, said redundancy codes each being a cyclic code based on a generating polynomial which is identical to said primitive polynomial, said redundancy code for said host data being calculated from said host data by said host data by said generating polynomial and said redundancy code for said redundancy data being calculated from said redundancy code for said host data; and
  writing said host data and said redundancy data to a plurality of magnetic disks.

14. The computer readable medium according to claim 13, wherein
  when writing said host data and said redundancy data: writing said host data and said redundancy code for said host data or (ii) said redundancy data and said redundancy code for the redundancy data over two magnetic disks of said plurality of magnetic disks, and writing the whole of one of the redundancy codes into either of the two magnetic disks.

15. The computer readable medium according to claim 14, wherein
  when generating said redundancy data, generating said redundancy code for said host data or said redundancy code for said redundancy data for each write unit of said magnetic disk, and
  when writing said host data and said redundancy data, writing (i) said host data and said redundancy code for said host data or (ii) said redundancy data and said redundancy code for the redundancy data to said two magnetic disks.

16. The computer readable medium according to claim 14, wherein
when generating said redundancy data, generating a plurality of pieces of said redundancy data for a plurality of pieces of said host data, and
when writing said host data and said redundancy data, writing the plurality of pieces of said host data and the plurality of pieces of said redundancy data to different magnetic disks of said plurality of magnetic disks, respectively, and
the method further comprising:
restoring, when said redundancy code calculated for a piece of said host data or a piece of said redundancy data read from a first magnetic disk of said plurality of magnetic disks is not identical to said redundancy code corresponding to the piece of said host data or the piece of said redundancy data read from a second magnetic disk of said plurality of magnetic disks, a whole of said first magnetic disk and said second magnetic disk by restoring a piece of said host data, a piece of said redundancy data, and said redundancy codes on said first magnetic disk and said second magnetic disk based on pieces of at least one of said host data and said redundancy data on the other magnetic disks of said plurality of magnetic disks.

17. The computer readable medium according to claim 16, wherein
when restoring said host data and said redundancy data, regenerating said redundancy code on said first magnetic disk and said second magnetic disk.

18. A disk array apparatus, comprising:
a storage means including a plurality of magnetic disks; and
a control means for: generating redundancy data for host data received from a host apparatus by a primitive polynomial of Galois extension field, said redundancy data being usable to restore one of said plurality of disks; generating a redundancy code for said host data and a redundancy code for said redundancy data, said redundancy codes being usable to detect an error of a corresponding one of said host data and said redundancy data, said redundancy codes each being a cyclic code based on a generating polynomial which is identical to said primitive polynomial, said redundancy code for said host data being calculated from said host data by said host data by said generating polynomial and said redundancy code for said redundancy data being calculated from said redundancy code for said host data and writing said host data and said redundancy data to said plurality of magnetic disks.

* * * * *